(12) United States Patent
Salsman et al.

(10) Patent No.: US 9,982,336 B2
(45) Date of Patent: May 29, 2018

(54) NANOSTRUCTURE LITHIUM ION BATTERY

(71) Applicant: Frontier Electronic Systems Corp, Stillwater, OK (US)

(72) Inventors: Lloyd Neal Salsman, Stillwater, OK (US); Brady Andrew Whisenhunt, Stillwater, OK (US)

(73) Assignee: Frontier Electronic Systems Corp., Stillwater, OK (US)

( * ) Notice: Subject to any disclaimer, the term of this patent is extended or adjusted under 35 U.S.C. 154(b) by 0 days. days.

(21) Appl. No.: 14/197,885

(22) Filed: Mar. 5, 2014

(65) Prior Publication Data

US 2014/0291141 A1 Oct. 2, 2014

Related U.S. Application Data

(60) Provisional application No. 61/773,090, filed on Mar. 5, 2013, provisional application No. 61/874,681, filed on Sep. 6, 2013.

(51) Int. Cl.
| | |
|---|---|
| *C23C 14/32* | (2006.01) |
| *C23C 14/34* | (2006.01) |
| *C23C 14/22* | (2006.01) |
| *H01M 4/04* | (2006.01) |
| *H01M 10/0525* | (2010.01) |

(Continued)

(52) U.S. Cl.
CPC ........ *C23C 14/3464* (2013.01); *C23C 14/225* (2013.01); *H01M 4/0426* (2013.01); *H01M 10/058* (2013.01); *H01M 10/0525* (2013.01)

(58) Field of Classification Search
CPC .......................... C23C 14/225; H01M 4/0426
See application file for complete search history.

(56) References Cited

U.S. PATENT DOCUMENTS

2003/0160589 A1* 8/2003 Krasnov et al. ............. 320/107
2007/0218333 A1* 9/2007 Iwamoto ...................... 429/30

OTHER PUBLICATIONS

Michael T. Taschuk, Matthew M. Hawkeye and Michael J. Brett, Chapter 13—Glancing Angle Deposition, In Handbook of Deposition Technologies for Films and Coatings (Third Edition), edited by Peter M. Martin, William Andrew Publishing, Boston, Jan. 2010, pp. 621-678, ISBN 9780815520313.*

* cited by examiner

*Primary Examiner* — Ibrahime A Abraham
(74) *Attorney, Agent, or Firm* — Martin S. High, P.C.

(57) ABSTRACT

The embodiments of the embodiments of the Nanostructure Lithium Ion Battery are comprised of a multi-layer coaxial assembly formed over a cylindrical core. The multilayers are each comprised of sublayers in order as follows: a copper sublayer with nano "chicken wire" embedded in the copper sublayer for current collection, a nanostructured aluminum substrate sublayer, a nanostructured cathode sublayer, an electrolyte sublayer, a nanostructured anode sublayer, and a copper interlayer sublayer. The nanobatteries are arranged in layered stacks of nanocells. The nanocells stacks are comprised of a plurality of individual octagonal shaped multi-layer nanocells. Each nanocell stack is electrically connected to an array of other nanocells stacks via electrode contacts. A lower copper bus serves as the anode current collector and an upper copper bus serves as the cathode current collector. Pass-throughs connect to the appropriate cathode layers in the multilayer nanocell stacks.

1 Claim, 11 Drawing Sheets

(51) Int. Cl.
*H01M 10/058* (2010.01)
*C23C 14/00* (2006.01)

NANOSTRUCTURE LITHIUM ION BATTERY

CROSS-REFERENCE TO RELATED APPLICATIONS

This application claims priority of the provisional patent application with Ser. No. 61/773,090 titled "Nanostructured Lithium Ion Battery" filed on Mar. 5, 2013 and the provisional patent application with Ser. No. 61/874,681 titled "Nanostructured Battery Packaging" filed on Sep. 6, 2013. The entire contents of U.S. provisional patent applications with Ser. Nos. 61/773,090 and 61/874,681 are herein incorporated by reference.

STATEMENT REGARDING FEDERALLY SPONSORED RESEARCH OR DEVELOPMENT

Not applicable

FIELD OF THE EMBODIMENTS

The field of the embodiments is batteries and more specifically the use of nanostructures to form a high energy capacity battery. The field of the embodiments is batteries and more specifically the packaging of nanostructured battery cells to make efficient use of space, weight, and to make secure electrical contact to the appropriate nanostructure layers.

BACKGROUND OF THE EMBODIMENTS

The background of the embodiments involves manufacture of high energy density batteries. More specifically, high energy density batteries manufactured from nanocomposite materials. In addition, the background of the embodiments involves manufacture of high energy density and high specific energy batteries. More specifically, high energy density batteries manufactured from nanocomposite structures and the packaging of these structures into useable battery packs.

As the demand for newer and better portable power sources has increased in recent years, viable alternatives to conventional battery construction have been an increasingly important area of research. Conventional batteries that have been on the market are limited by several factors, one of the most important being the tradeoff between the size of the battery compared to the amount of power that is capable of being delivered. Factors affecting the overall viability of commercial batteries include inefficient use of the material volume, limited active area at the electrode surfaces, low mechanical and thermal compliance for a high stress environments, low charge/discharge rate, and low shelf life due to excess leakage current.

The problem often encountered is that small changes in the structure of battery geometry can produce dramatic effects on top-level performance. "Tab effects," for instance, arise when the physical proximity of the positive and negative terminals are not carefully considered. If the terminals are too close, the current density inside the battery is too highly concentrated, giving rise to overheating issues and "hot-spots" (See FIG. 1). If large portions of volume inside the battery are not conducting current, the battery loses energy density, and the cost of the materials needed to produce the battery outweighs the decreased economic viability of the product. The electrical performance consequences of these phenomena are manifested in compromised power output.

If current collectors are too far apart, again, energy density is compromised. This time, the separation of charge between the terminals is increased, giving rise to lower ion conduction, and therefore, lower power delivery. Lower total power delivery decreases the usefulness of the battery, and despite the gains in safety due to decreased risk of hot spots, the economic viability of the battery is compromised.

SUMMARY OF THE EMBODIMENTS

Embodiments of the Nanostructure Lithium Ion Battery are comprised of a multi-layer coaxial assembly formed over a cylindrical core. The multilayers are each comprised of sublayers in order as follows: a copper sublayer with "nano-chicken wire" embedded in the copper sublayer for current collection, a nanostructured aluminum substrate sublayer, a nanostructured cathode sublayer, an electrolyte sublayer, a nanostructured anode sublayer, and a copper interlayer sublayer. The multilayers are repeated two or more times on the cylindrical core to form embodiments of the Nanostructure Lithium Ion Battery.

Manufacturing of the embodiments of the Nanostructure Lithium Ion Battery are comprised of a series of sputtering stations laying down the appropriate material in the order required for performance of the battery. See FIG. 5. Nanostructures are formed by an oblique sputtering technique whereby the normal to the plane of the sputtering target is at a non-normal angle to the battery core.

In this respect, it is to be understood that the embodiments in this application are not limited to the details of construction and to the arrangements of the components set forth in the description or illustrated in the drawings. The embodiments are capable of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the embodiments described in this application. Additional benefits and advantages of the present embodiments will become apparent in those skilled in the art to which the embodiments relate from the description of the preferred embodiment and the appended claims, taken in conjunction with the accompanying drawings. It is important, therefore, that the claims be regarded as including such equivalent constructions insofar as they do not depart from the spirit and scope of the embodiments described herein.

Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application. The abstract is neither intended to define the embodiments of the application, which is measured by the claims, nor is it intended to be limiting as to the scope of the embodiments in any way.

DETAILED DESCRIPTION OF THE PREFERRED EMBODIMENTS

Embodiments of the Nanostructure Lithium Ion Battery are comprised of a multi-layer coaxial assembly formed over a cylindrical core. The multilayers are each comprised of sublayers in order as follows: a copper sublayer with "nanochicken wire" embedded in the copper sublayer for current collection, a nanostructured aluminum substrate sublayer, a nanostructured cathode sublayer, an electrolyte sublayer, a nanostructured anode sublayer, and a copper interlayer sublayer. The multilayers are repeated two or more times on the cylindrical core to form embodiments of the Nanostructure Lithium Ion Battery.

The nanostructured aluminum substrate sublayer, nanostructured cathode sublayer, and the nanostructured anode sublayer, are formed from an oblique sputtering process. When the material in question (the aluminum, cathode or anode material) are to be formed the sputtering head is positioned such that the normal to the sputtering target is at an oblique angle to the surface of the core sublayer. The oblique angle can range between 45 and 60 degrees from the normal to the surface of the core sublayer. The sputtering and the oblique angle forms nanostructures called "nanobaskets" that dramatically increase the surface area of the material in question leading to enhanced performance of embodiments.

In embodiments of the of the Nanostructure Lithium Ion Battery, the nanostructured aluminum substrate sublayer, nanostructured cathode sublayer, and the nanostructured anode sublayer, are comprised of nanobaskets formed from the oblique sputtering process.

A nanostructured electrode comprised of numerous "nanobaskets" provides a framework for enhanced use of the materials involved, at a fraction of the physical size of the battery. The layer thicknesses of the nanocomposite battery are not on the order of millimeters (such as a typical coin cell battery), but rather, in the vicinity of hundreds of nanometers to several microns. The battery has shown to be functional at an active region thickness (not counting current collectors) of less than 13 microns, and these thin layer structures can be manufactured in layers large enough to meet the end application.

Figure 8:
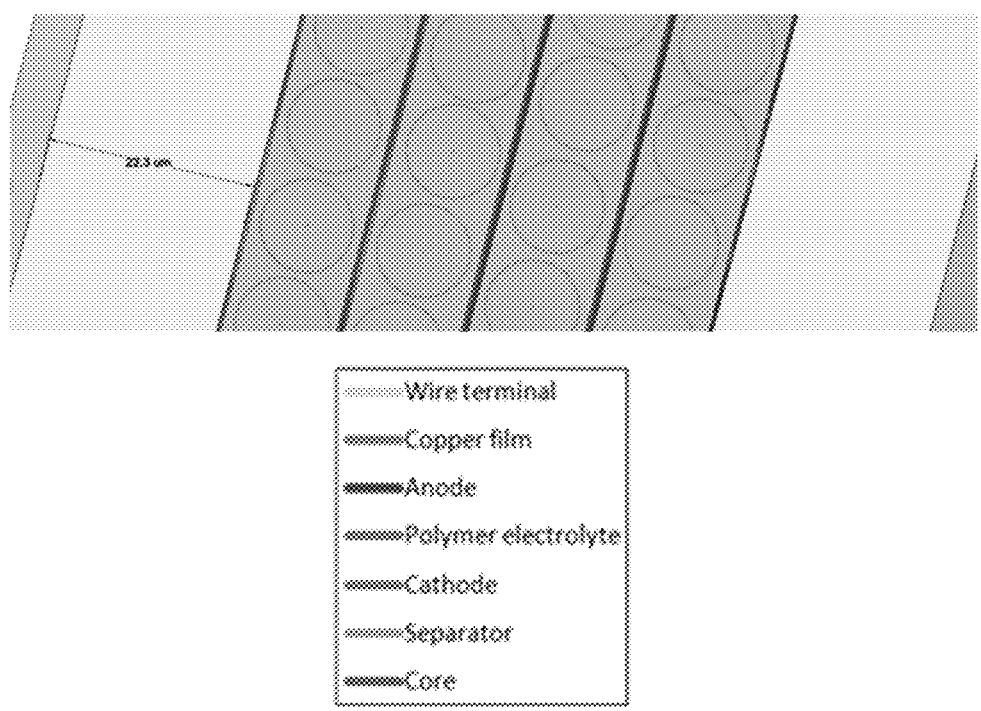
FIG. 8 is a schematic view of the basic four-cell stack of the corndog configuration to scale. This fundamental structure is repeated until the desired battery radius is achieved.
Figure 9:
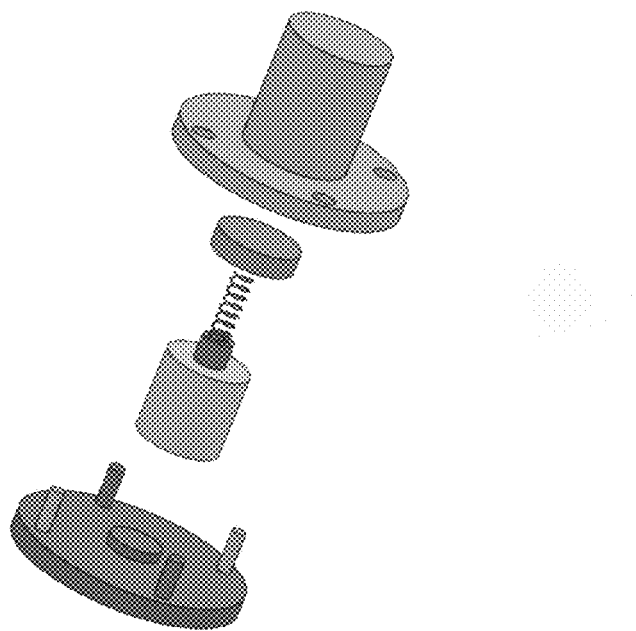
FIG. 9 is a schematic view of the cell carrier.
Figure 10:
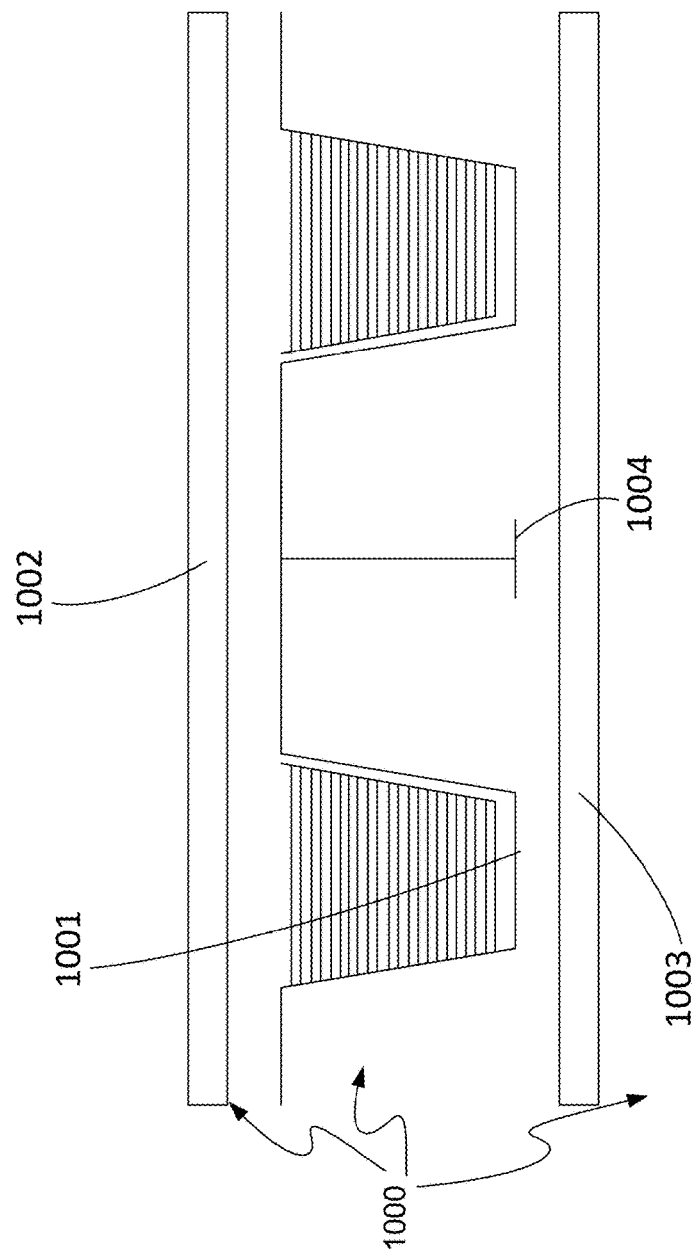
FIG. 10 is a schematic side view of an embodiment of the basic structure of the nanocomposite battery layers and interconnects.
Figure 11:
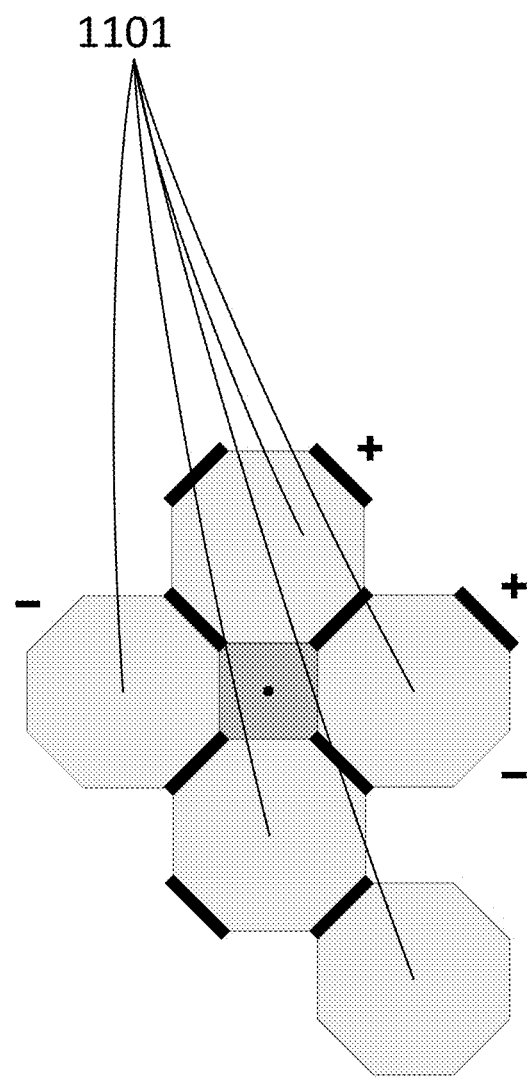
FIG. 11 is schematic top view of an embodiment of the basic structure of the nanocomposite battery layers and interconnects.

The manufacturing processes involved in building a corndog battery is the use of oblique radio-frequency ("RF") sputtering. RF Sputtering of oxides onto smooth surfaces at oblique angles produces periodic surface corrugations. FIG. 8 illustrates the concept.

The advantage of this technique in the context of the corndog cell is that when sputtering a cylindrical sample, oblique incidence is by default the natural orientation of the incident particle's path. So, if the cylindrical core can be rotated inside the sputtering system at a pre-determined rate, the formation of a porous nanostructured electrode can be achieved quickly, with no need for a pre-formed template. The primary difference between the surface features formed in an oblique system versus a normally-incident system is that the surface features are positive rather than negative. That is, rather than forming nanobaskets on top of a defined structure of pits, the pores are essentially "nanohills" grown on top of an originally smooth metallic film.

The length of a thin film battery cell of this type could be made large, while the layer thickness remains on the order of microns. This stacked nanocomposite battery would have hundreds of thin film cells inside it, where a typical battery only has a handful.

The nanocomposite battery is mechanically flexible, owing to the presence of the polymer electrolyte. The polymer electrolyte's gel-like texture soaks into the structured electrode's pores, and provides a medium for lithium ion mobility as well as physical stability of the structure. The benefits of the corndog structure are numerous, not the least of which is the potential to manufacture high-performance batteries into flexible materials such as textiles or garments.

Figure 4:
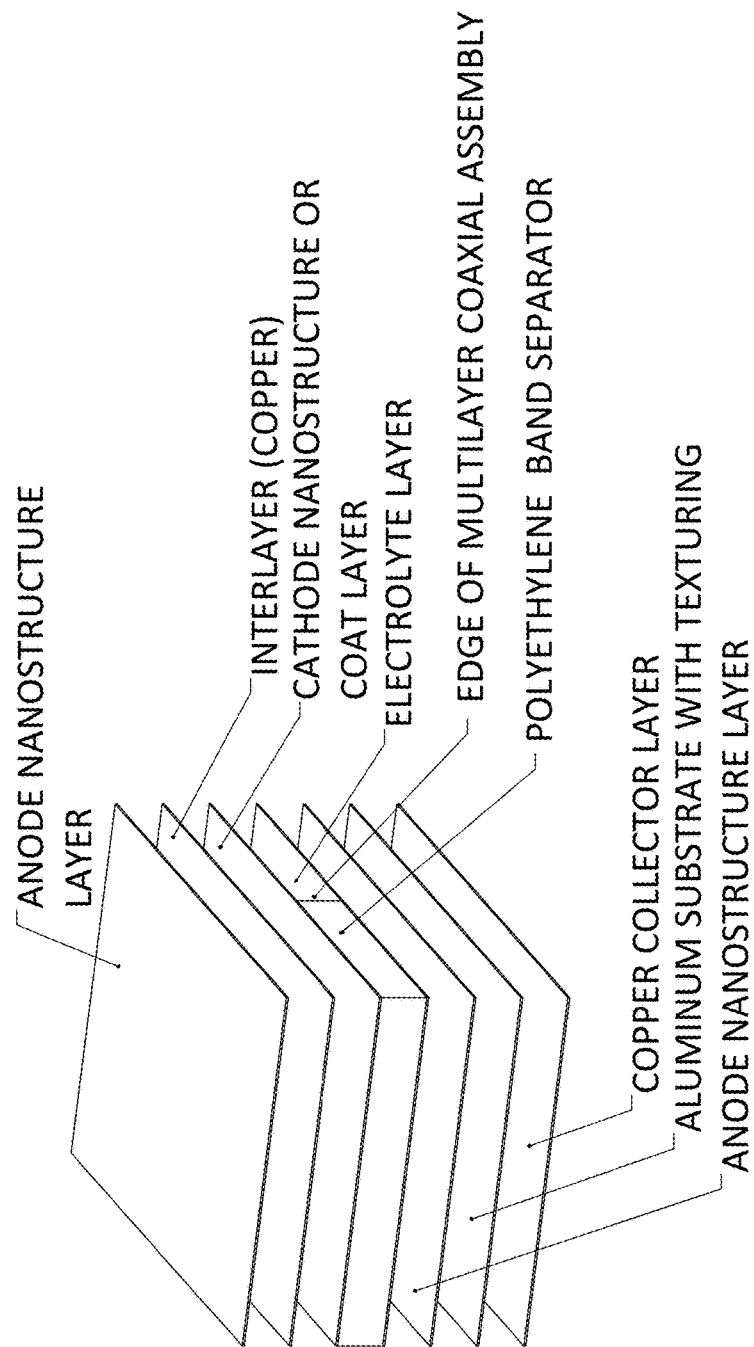
FIG. 4 is a schematic view of an embodiment of the layers of the nanocomposite battery layers shown relative to each other.
Figure 5:
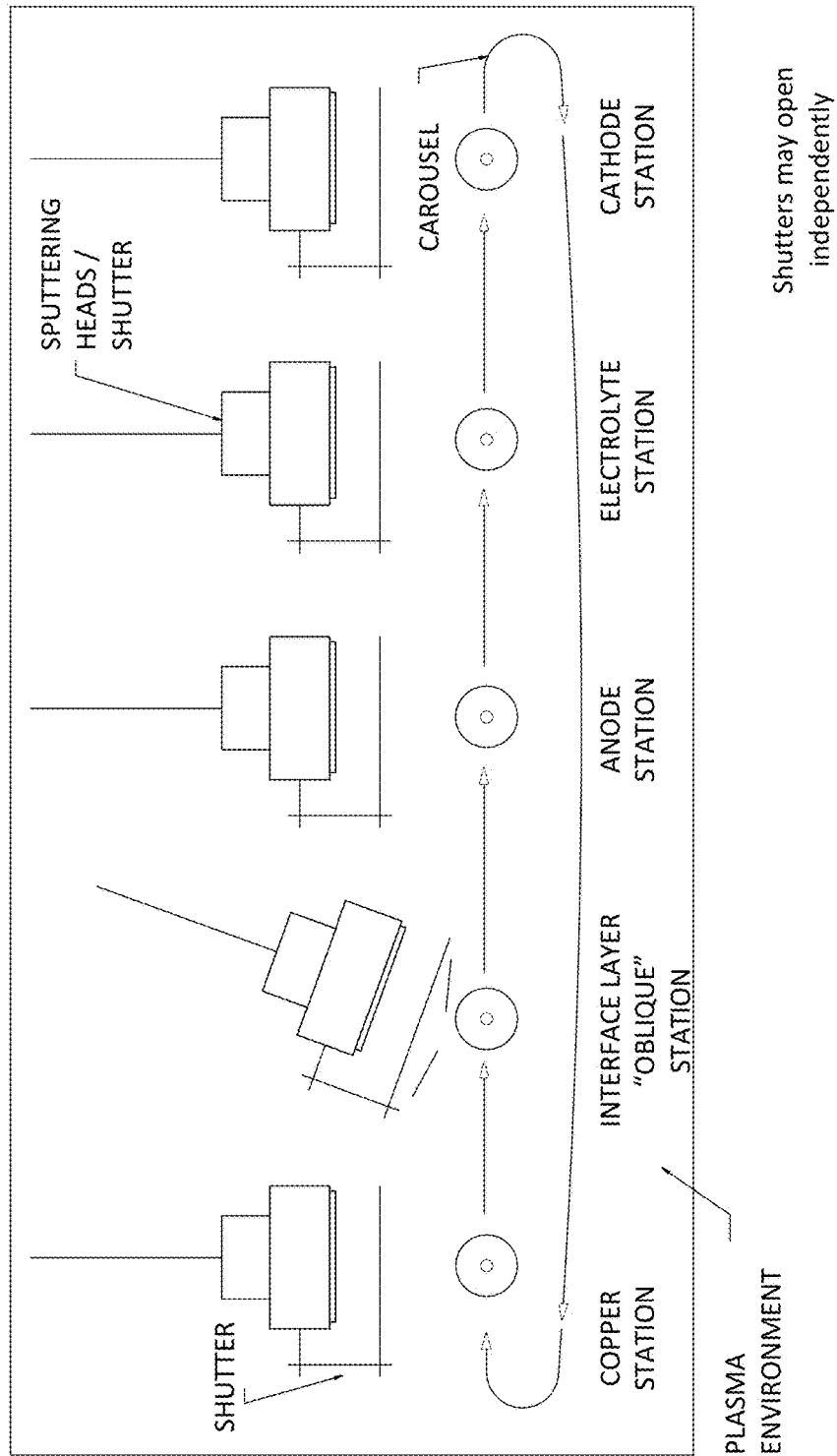
FIG. 5 is a schematic view of an embodiment of the process of forming the layers of the nanocomposite battery.
Figure 6:
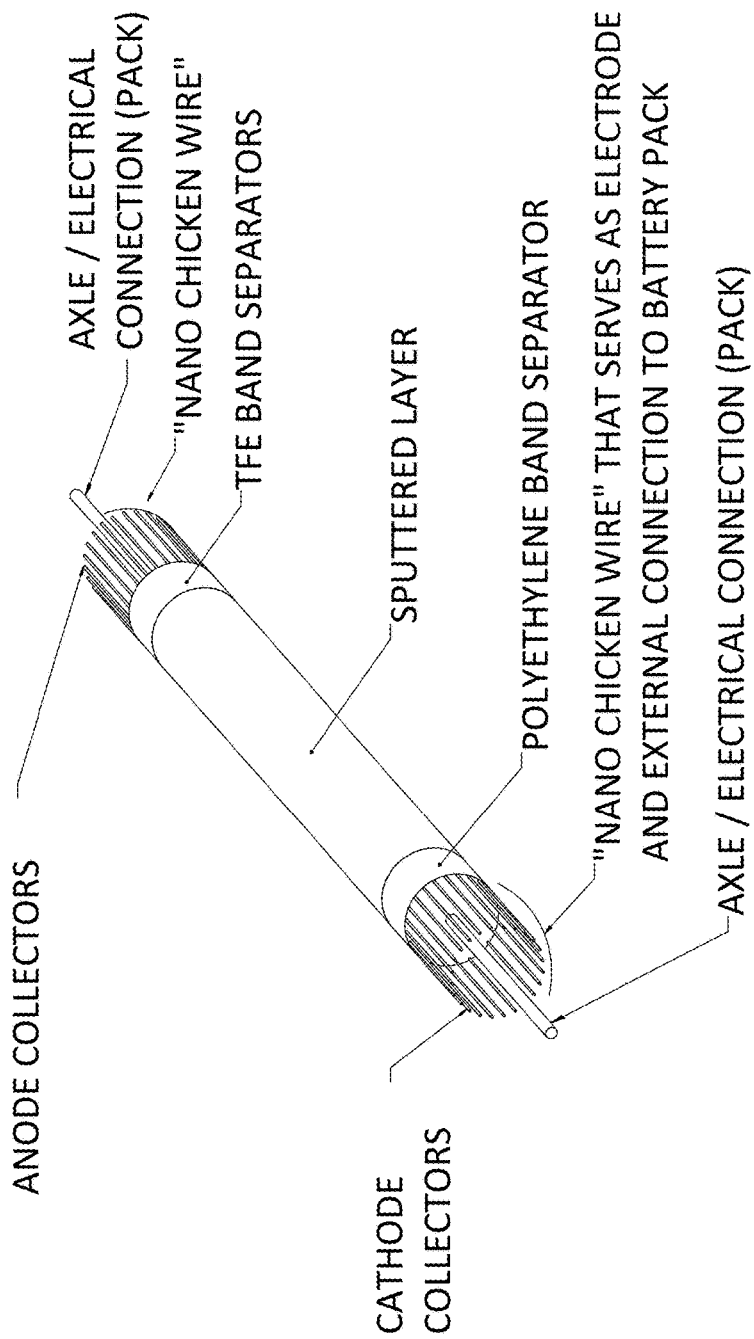
FIG. 6 is a schematic view of an embodiment of the nanocomposite battery showing the orientation of the currently collection devices relative to the core of the nanocomposite battery.
Figure 7:
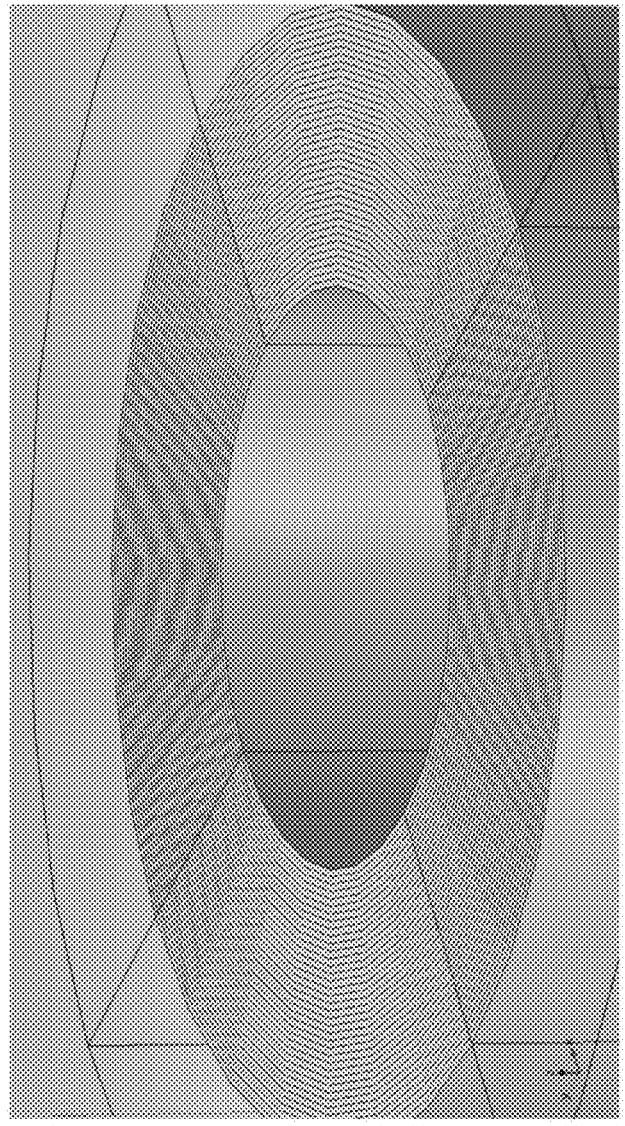
FIG. 7 is a schematic view of an embodiment of the nanocomposite battery showing how many battery cells can be manufactured in a cylindrical fashion.

The geometry of the corndog cell involves a single, cylindrical thin film battery cell cascaded in series of four concentric rings. Each four-cell ring is then stacked concentrically. The stacking of four-cell rings is repeated indefinitely, until the entire battery cell stack reaches its desired thickness. The basic premise is shown below in FIGS. 4 and 5.

First, a 22.3 micron-thick copper wire is secured into place around a cylindrical core by sputtering a thin copper film over the core and wire. The thin copper layer acts as a current collector for the nanostructured anode layer, which is RF sputtered on top of the copper layer. The inner stackup is rotated about the z-axis in order to ensure even coating. The next layer outwards is the PEO electrolyte layer, in which ceramic microspheres are present. The PEO/microsphere layer is several microns thick, and is either sputtered or "painted" on using an aerosol-like process. On top of this layer is sputtered the cathode, which may be either nanostructured or solid. If the cathode is nanostructured it is formed in the same fashion as the anode. Next, a thin layer of copper is sputtered onto the outer layer to act as a current collector.

Another winding of thin film battery cell is sputtered on top of the stack, followed by another copper current collector layer, and so forth, until a total of four battery cells have been laid down on top of each other. On top of the outer copper current collector layer, a new length of copper wire is added to the outside edge of the four-cell stack, followed by a battery separator material such as a porous polymer battery separator membrane manufactured from polyethylene or polypropylene. A porous polymer battery separator membrane impregnated with non-lithiated PEO works well as both an electrical insulator and a structural stabilizer.

Calculations show that the corndog battery achieves significantly greater energy densities over the Energizer CR2032. It is predicted that the energy density of the corndog cell is over 5 times the Energizer feature by weight and over 7 times the energy density of the Energizer by volume.

A nanocomposite battery is formed by plasma vapor deposition of constituent layers of a multiple layer assembly. The method of forming a nanocomposite battery comprises the steps of a) sputtering a conductive layer onto a substrate; b) sputtering an aluminum layer at an oblique angle onto the surface of the conducting layer; c) sputtering an anode material layer on the surface of the aluminum; d) sputtering an electrolyte layer onto the anode layer; e) sputtering a cathode material layer on the surface of the electrolyte; f) sputtering a conducting layer on the surface of the cathode; g) repeating of steps a through f until the required number of layers are formed, and h) sealing the layers by sputtering insulating polymer strips.

The method of determining the alternating current electrical characteristics of a coating is comprised of the steps of a) coating the inner conductor of an air coaxial transmission line with the coating to be analyzed, b) performing an impedance analysis of the coating and coaxial line to determine the physical and electrical properties of the coating as an electrolyte for a nanocomposite battery system of multilayered nanostructured materials.

The method of forming a nanocomposite battery comprising the isolation of the end portions of the multilayered nanocomposite battery. The method of forming a current collecting structure wherein anode connections emanate from one end of the battery and the cathode connections at the other end. At each end a method of integrating the connections to make external battery connections and mechanical support are employed.

The method of forming a nanocomposite battery comprises the use of oblique sputtering to form a nanoscale electrode template.

The method of forming a nanocomposite battery comprises the steps of adding layers of mechanical enhancers to the multilayered assembly for the purposes of strengthening the mechanical properties of the overall multilayered battery assembly.

A carrier for the multilayered nanocomposite battery to determine the mechanical properties of the nanocomposite battery comprises a) a platform with Kelvin probe compliant contact material; b) a piston structure; c) a compliant electrical contact using Kelvin probe; d) an adjustable spring force assembly; e) an atmospheric seal; and an external heater interface. The cell carrier is comprised of a "mesa" type architecture, and allows variable pressure to be applied to the battery terminals. The cell carrier also allows easy access to the battery terminals. The cell carrier is compatible with operation inside a glove box environment, and its rugged mechanical integrity allows precise measurements to be made in a repeatable manner.

The method of analyzing the performance of the multi-layered nanocomposite battery comprises: a) a prototype cell carrier; b) a charge/discharge unit electrical connections; c) a cell loading and unloading means under controller atmosphere; and d) network analyzer connection for dynamic impedance analysis.

The method of forming a nanocomposite battery comprises the steps of sputtering nanocomposite or nanostructured electrodes using oblique sputtering to form the nanostructured electrodes. The method of forming a nanocomposite battery can be manufactured where in all the layers are formed by sputtering.

Figure 1:
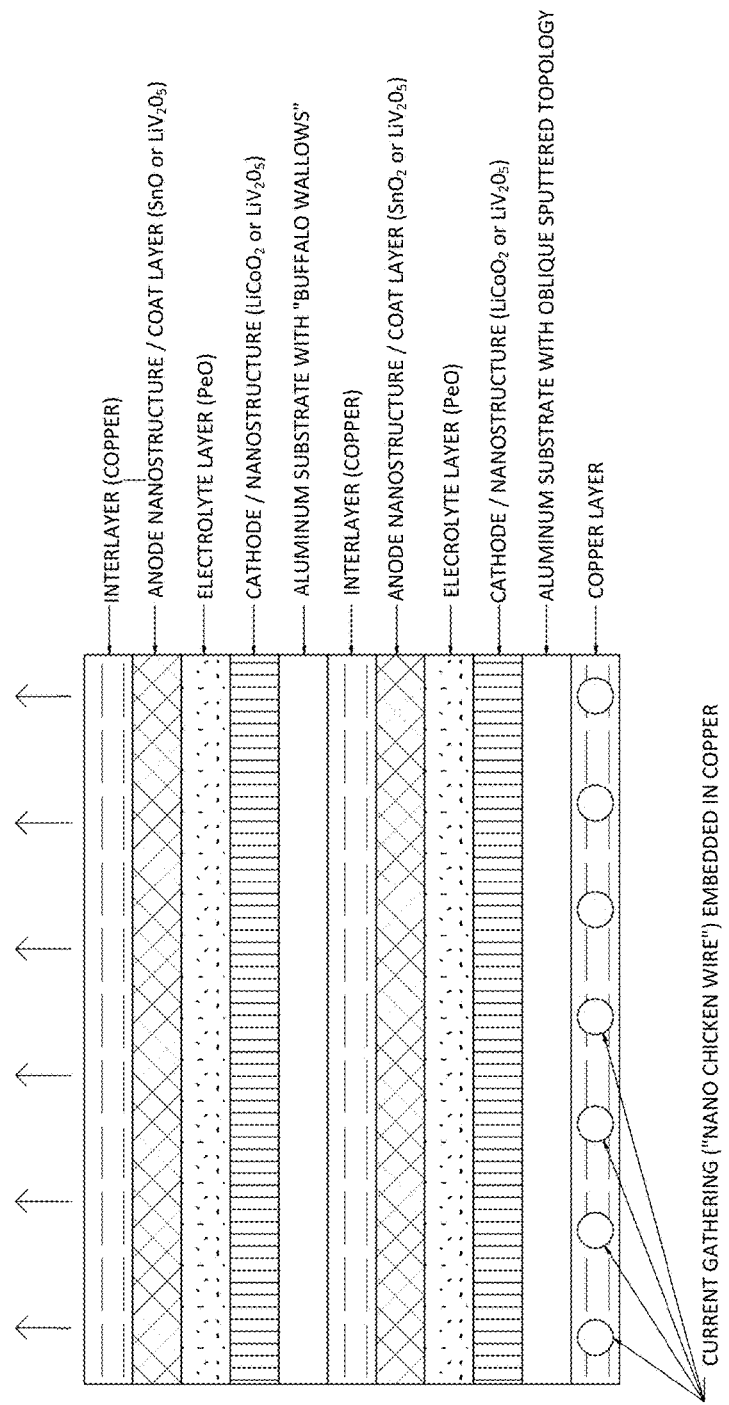
FIG. 1 is a schematic view of an embodiment of the basic structure of the nanocomposite battery layers shown in a rectilinear fashion.
Figure 2:
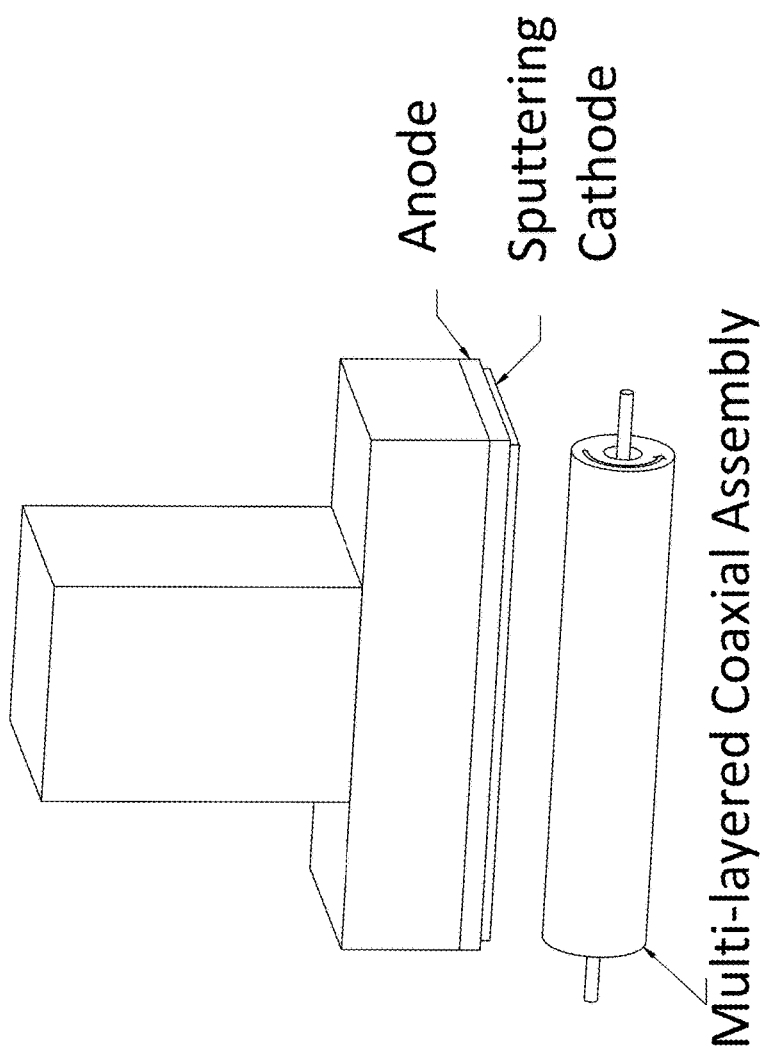
FIG. 2 is a schematic view of an embodiment of the oblique sputtering of the cathode layers onto the core structure of the nanocomposite battery.
Figure 3:
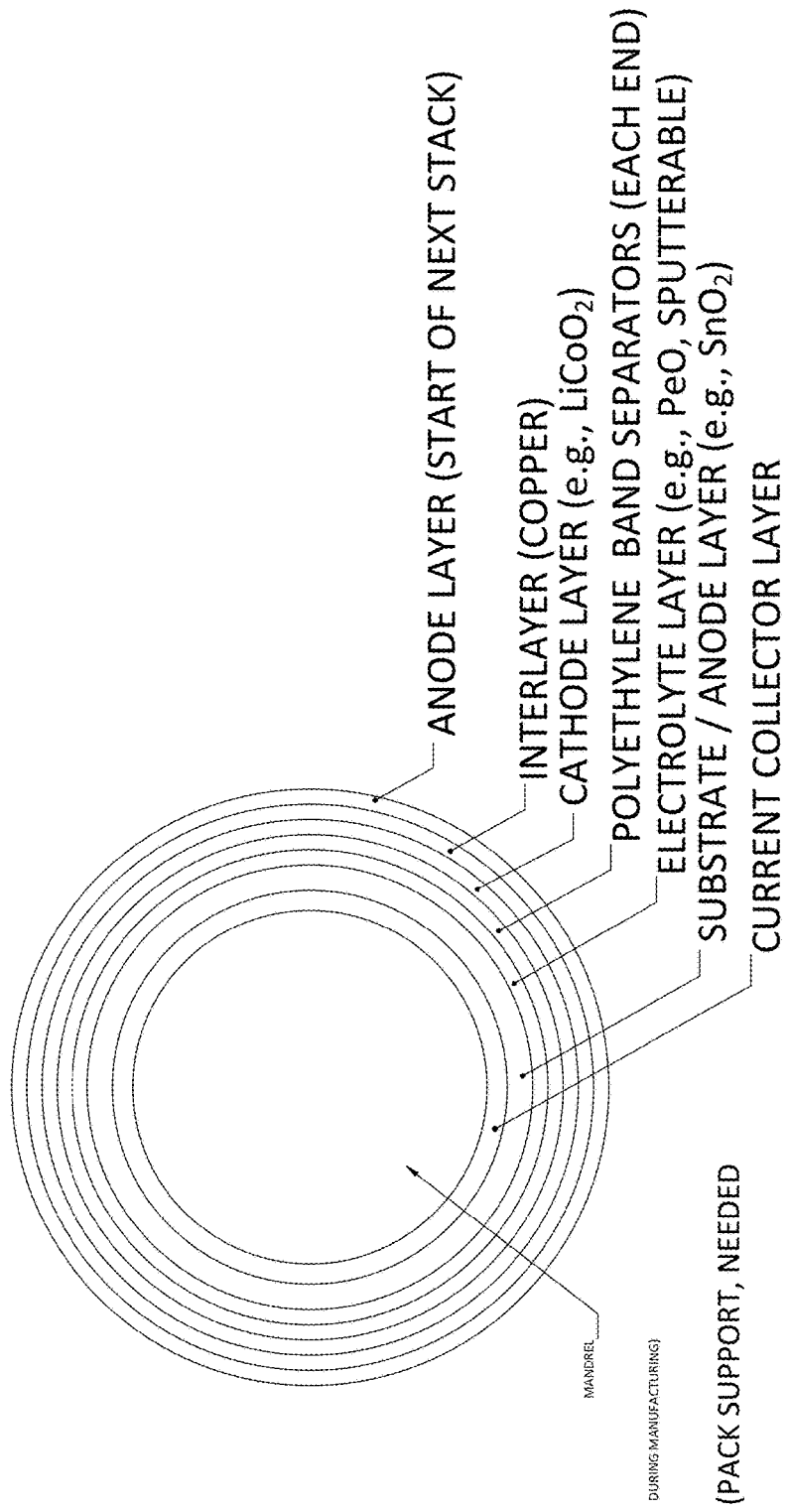
FIG. 3 is a schematic view of an embodiment of the nanocomposite battery layers deposited on the core structure of the nanocomposite battery showing the layers deposited in a cylindrical fashion.

Embodiments of the Nanostructure Battery Packaging 1000 are comprised of arrays of layered stacks of nanocells. 1000 The nanocells stacks 1001 are comprised of a plurality of individual octagonal shaped multilayer nanocells. Each nanocell stack 1001 is electrically connected to an array of other nanocells stacks via electrode contacts. The positive electrode contacts are arranged at the intersection between contact points of adjacent nanocell stacks 1001. See FIG. 1. The nanocell stacks 1001 are multilayer battery cells formed in the shape of octagons. See FIG. 2. The octagonal shape permits efficient and effective interconnects of the multilayers in the nanocell stacks 1001 and provides proper electrical contact to external circuitry. A lower copper bus 1003 serves as the anode current collector and an upper copper bus 1002 serves as the cathode current collector. The upper copper anode bus 1002 is connected to the appropriate cathode layers in the multilayer nanocell stacks 1001 via bridge points. The lower copper cathode bus 1003 is connected to the appropriate cathode layers in the nanocell stacks 1001 via pass-throughs 1004. The pass-throughs 1004 connect to the appropriate cathode layers in the multilayer nanocell stacks 1001.

The multilayer nanocell stacks 1001 are formed through a sputtering process to build up battery cell layers one on top of another until a two or more layers are formed as per the specification of the application for the overall battery.

The layers formed by the upper copper bus 1002 the nanocell stacks 1001 and the lower copper bus 1003 form the overall nanobattery cells. The nanocell stacks 1001 may be formed to conform to various geometries such as curved or wavy surfaces or otherwise conformal shaped. The flexibility of the layers can be controlled by allowing voids to form between the nanocell stacks and the welds that connect the nanocell stacks 1001 between octagonal shaped nanocell stacks 1001.

The upper copper bus 1002 and the lower copper bus 1003 can both be multilayer printed wiring boards that allow controlled electrical interconnects to provide flexibility of contacts between the application device and the individual battery cells. The upper copper bus 1002 and the lower copper bus 1003 allows for impedance control between the external interface and individual battery cells.

The walls of the octagonal shaped multilayer nanocell stacks 1001 slope so as to build up sufficient copper area as the multilayer of the cells. The layers formed by the upper copper bus 1002 the nanocell stacks 1001 and the lower copper bus 1003 are assembled via ultrasonic welding or adhesive welding.

The shape and size of the arrays lends itself to being constructed with 3-D printing technology. The array or trays can be constructed with 3-D printing technology to permit a wide variety of shapes, sizes, areal density. Varying the areal density of the arrays can determine the stiffness of the overall tray for varying applications. By including voids in the array structure, the density can be further modified for varying applications. The tray geometry can be designed and implemented using 3-D technology.

What is claimed is:
1. The method of forming a nanocomposite battery by plasma vapor deposition of constituent layers of a multiple layer assembly leading to enhanced capacity comprising the steps of a. securing a 22.3 micron-thick copper wire around a cylindrical core by sputtering a thin copper film over the cylindrical core and wire;
b. nanostructured anode layer is sputtered where the cylindrical core is rotated about the z-axis in order to ensure even coating;
c. a Polyethylene Oxide (PEO) microsphere layer is either sputtered or painted on using an aerosol process;
d. sputtering a conductive layer while rotating the cylindrical core inside the sputtering system at a pre-determined rate;
e. sputtering an aluminum layer at an oblique angle onto the surface of the conductive layer wherein the oblique angle is between 45 and 60 degrees from the normal to the surface of the cylindrical core to form nanostructures formed by the oblique angle sputtering that increases the surface area of the aluminum layer leading to enhanced capacity;
f. sputtering an anode material layer on the surface of the aluminum layer;
g. sputtering an electrolyte layer onto the anode material layer;
h. sputtering a cathode material layer on the surface of the electrolyte layer;
i. sputtering another conductive layer on the surface of the cathode material layer;
j. repeat steps e through i until entire battery cell stack reaches its desired thickness, and
k. sealing the layers by sputtering insulating polymer strips.

* * * * *